(12) United States Patent
Du et al.

(10) Patent No.: US 7,848,110 B2
(45) Date of Patent: Dec. 7, 2010

(54) SLIDE RAIL STRUCTURE

(75) Inventors: Lian-Chang Du, Shanghai (CN); Shou-Jen Yang, Taipei (TW)

(73) Assignee: Inventec Corporation, Taipei (TW)

( * ) Notice: Subject to any disclaimer, the term of this patent is extended or adjusted under 35 U.S.C. 154(b) by 113 days.

(21) Appl. No.: 12/273,283

(22) Filed: Nov. 18, 2008

(65) Prior Publication Data

US 2010/0033926 A1 Feb. 11, 2010

(30) Foreign Application Priority Data

Aug. 8, 2008 (CN) .................. 2008 1 0145470

(51) Int. Cl.
*H05K 7/14* (2006.01)

(52) U.S. Cl. .................. 361/727; 361/726; 361/679.02; 211/26

(58) Field of Classification Search ......... 361/724–727, 361/679.02; 211/26; 312/223.1–223.2

See application file for complete search history.

(56) References Cited

U.S. PATENT DOCUMENTS

| | | | |
|---|---|---|---|
| 6,948,691 B2 * | 9/2005 | Brock et al. | 248/222.13 |
| 7,187,554 B2 * | 3/2007 | Seki et al. | 361/727 |
| 7,675,742 B2 * | 3/2010 | Wu et al. | 361/679.08 |
| 2004/0020874 A1 * | 2/2004 | Haney | 211/26 |

* cited by examiner

*Primary Examiner*—Jayprakash N Gandhi
*Assistant Examiner*—Ingrid Wright
(74) *Attorney, Agent, or Firm*—J.C. Patents

(57) ABSTRACT

A slide rail structure disposed between a computer case and a rack is provided. The slide rail structure includes a first slide rail, a second slide rail, and a third slide rail. The first slide rail is fastened to the rack. The second slide rail has a first end, a second end, and a carrier. The second slide rail is fastened to the rack through the first end and is connected to the first slide rail through the second end. The carrier is in contact with a bottom panel of the computer case so that the computer case can slide on the carrier. The third slide rail is slidingly disposed to the second slide rail and has a locking portion. A locking component is fastened to the computer case and is locked with the locking portion so that the third slide rail can move along with the computer case.

12 Claims, 4 Drawing Sheets

SLIDE RAIL STRUCTURE

CROSS-REFERENCE TO RELATED APPLICATION

This application claims the priority benefit of P.R.C. patent application serial no. 200810145470.1, filed on Aug. 8, 2008. The entirety of the above-mentioned patent application is hereby incorporated by reference herein and made a part of specification.

BACKGROUND OF THE INVENTION

1. Field of the Invention

The present invention generally relates to a slide rail structure, and more particular, to a slide rail structure for a computer.

2. Description of Related Art

Generally speaking, computers can be categorized into personal computers (PCs), servers, and supercomputers according to the applications thereof. A PC usually has one or two processors and is used for processing general business documents or multimedia information. Servers are usually used for performing more complicated tasks or for storing larger quantity of data. Servers disposed with two to four, or even up to eight or sixteen processors are usually used in order to meet the present requirements of network computing. Supercomputers having hundreds or even thousands processors connected in series are usually adopted in high performance computing.

Presently, the most commonly used servers are rack mount computers which can be stacked and connected in series. According to this design, the motherboard in a rack mount computer is greatly reduced in its size, and a central processing unit (CPU), a chipset, a memory, and a hard disk are respectively disposed on the motherboard, and the motherboard is then mounted onto a rack through slide rails. As a result, the space taken by the motherboard can be reduced and the motherboard itself can be replaced conveniently. Each server is actually an independent and replaceable computer and which has been developed into today's rack mount server having slim appearance, high space efficiency, lower power consumption, and easy management.

Slide rail structures are usually disposed in pairs on both sides of a computer for supporting the computer and guiding the computer to horizontally move into or out of the rack. Moreover, a slide rail structure usually includes an external slide rail and an internal slide rail which work together to allow a computer to move correspondingly to the rack.

However, the internal slide rail has to be assembled to one side of the computer to work together with the external slide rail assembled to the rack. In other words, there must be enough space between the computer and the rack for accommodating both the internal and the external slide rail in order to fabricate the slide rails and the computer. Accordingly, a wider computer may not be installed onto a rack when too much space is taken by the internal and external slide rails.

SUMMARY OF THE INVENTION

Accordingly, the present invention is directed to a slide rail structure which requires less disposition space.

The present invention provides a slide rail structure disposed between a computer case and a rack. The slide rail structure includes a first slide rail, a second slide rail, and a third slide rail. The first slide rail is fastened to the rack. The second slide rail has a first end, a second end, and a carrier. The second slide rail is fastened to the rack through the first end thereof and is connected to the first slide rail through the second end thereof. The carrier is in contact with a bottom panel of the computer case so that the computer case can slide on the carrier. The third slide rail is slidingly disposed to the second slide rail and has a locking portion. A locking component is fastened to the computer case and locked with the locking portion so that the third slide rail can move along with the computer case.

According to an embodiment of the present invention, the first slide rail has a first blocking portion, and the third slide rail has a second blocking portion corresponding to the first blocking portion for restricting the displacement of the third slide rail toward the inside of the rack.

According to an embodiment of the present invention, the third slide rail further has a third blocking portion, and when the computer case moves towards the inside of the rack, the computer case contacts the third blocking portion and accordingly brings the third slide rail to move toward the inside of the rack.

According to an embodiment of the present invention, the slide rail structure further includes a holder fastened to the rack and the first end of the second slide rail such that the second slide rail is fastened to the rack through the holder.

According to an embodiment of the present invention, the holder has a fourth blocking portion, and the third slide rail further has a fifth blocking portion corresponding to the fourth blocking portion for restricting the displacement of the third slide rail toward the outside of the rack.

According to an embodiment of the present invention, through the interaction between the position of the locking portion on the third slide rail and the position of the locking component on the computer case, the the center of gravity of the computer case is not out of the rack when the fifth blocking portion is blocked by the fourth blocking portion.

According to an embodiment of the present invention, the locking component is a metallic spring leaf.

According to an embodiment of the present invention, the locking component has at least one hook, and the locking portion is a hook hole corresponding to the hook.

According to an embodiment of the present invention, the locking component is fastened to the internal wall of a side panel of the computer case, and the hook passes through the side panel and protrudes to the outside of the side panel.

According to an embodiment of the present invention, the locking component is unlocked form the locking portion when the locking component is under an action force and bends towards the inside of the computer case.

According to an embodiment of the present invention, the first slide rail covers at least part of the second slide rail, and the second slide rail covers at least part of the third slide rail.

According to an embodiment of the present invention, the slide rail structure further includes a plurality of fasteners, and the first slide rail has a slide slot, wherein the fasteners respectively go through the slide slot to be fastened to the second slide rail.

According to an embodiment of the present invention, the second slide rail is slidingly disposed to the first slide rail through the second end thereof.

In a slide rail structure provided by the present invention, a computer case is supported by a carrier of a second slide rail so that the computer case can slide on the carrier. Thus, there is no need to fabricate any slide rail to the computer case. As a result, the space required for fabricating slide rail between the computer case and the rack can be saved and accordingly the slide rail structure in the present invention can be disposed in a narrower space. Moreover, in a slide rail structure provided by the present invention, a computer case is prevented from tilting forwards by locking a locking component on the computer case to a locking portion of a third slide rail.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
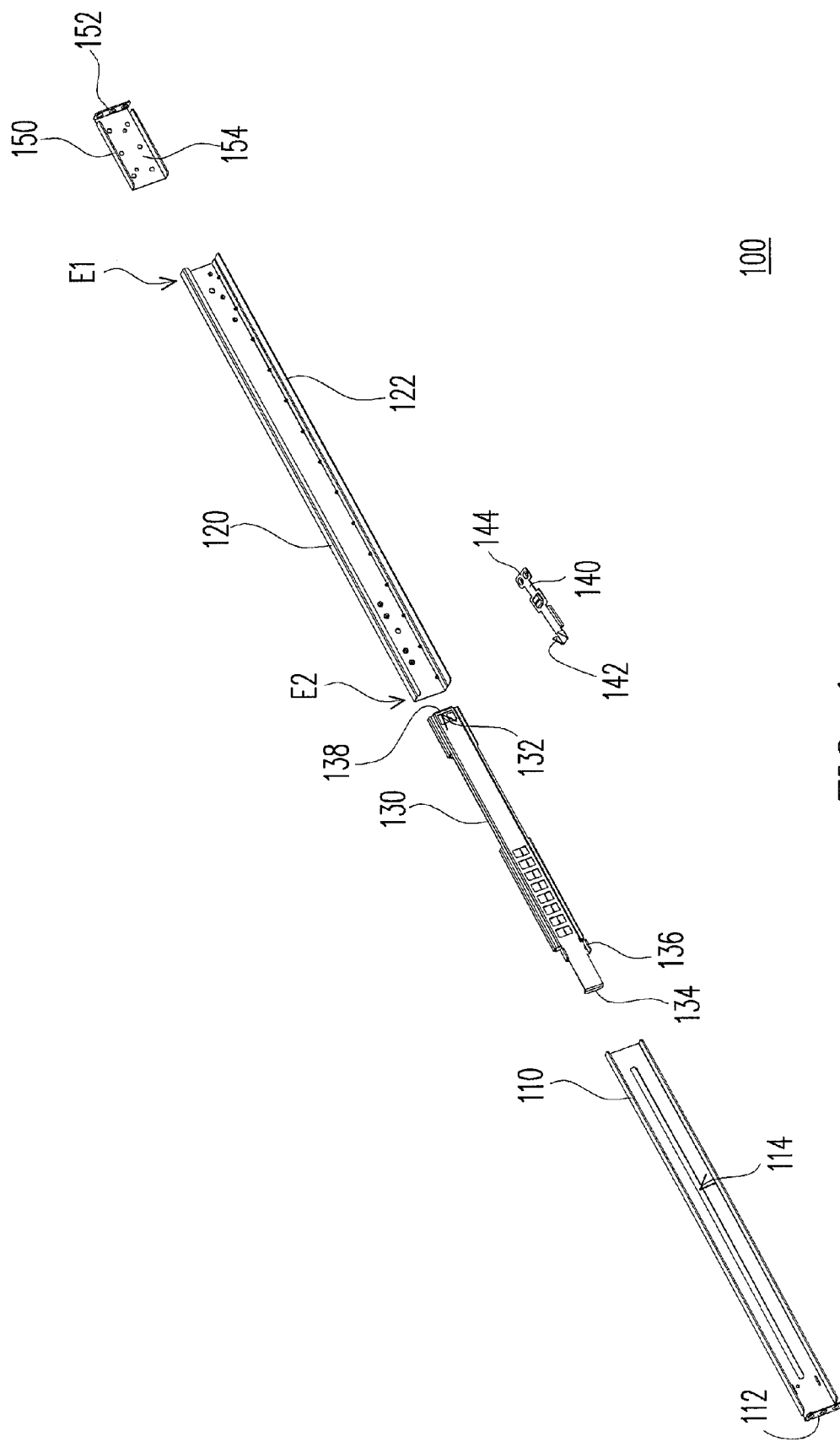
FIG. 1 is an exploded view of a computer case and a slide rail structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
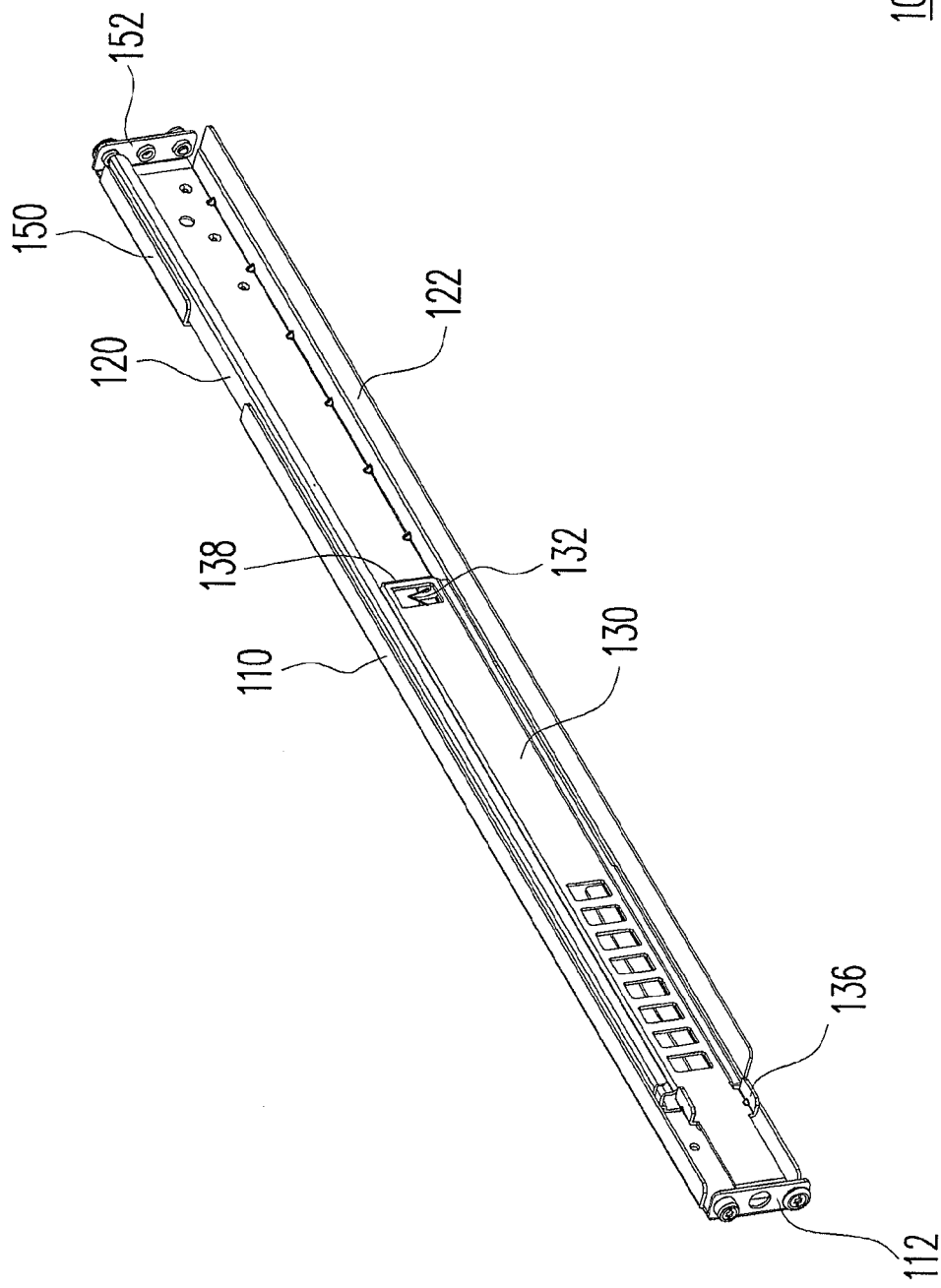
FIG. 2 is a comprehensive diagram of the computer case and the slide rail structure in FIG. 1.
Figure 3:
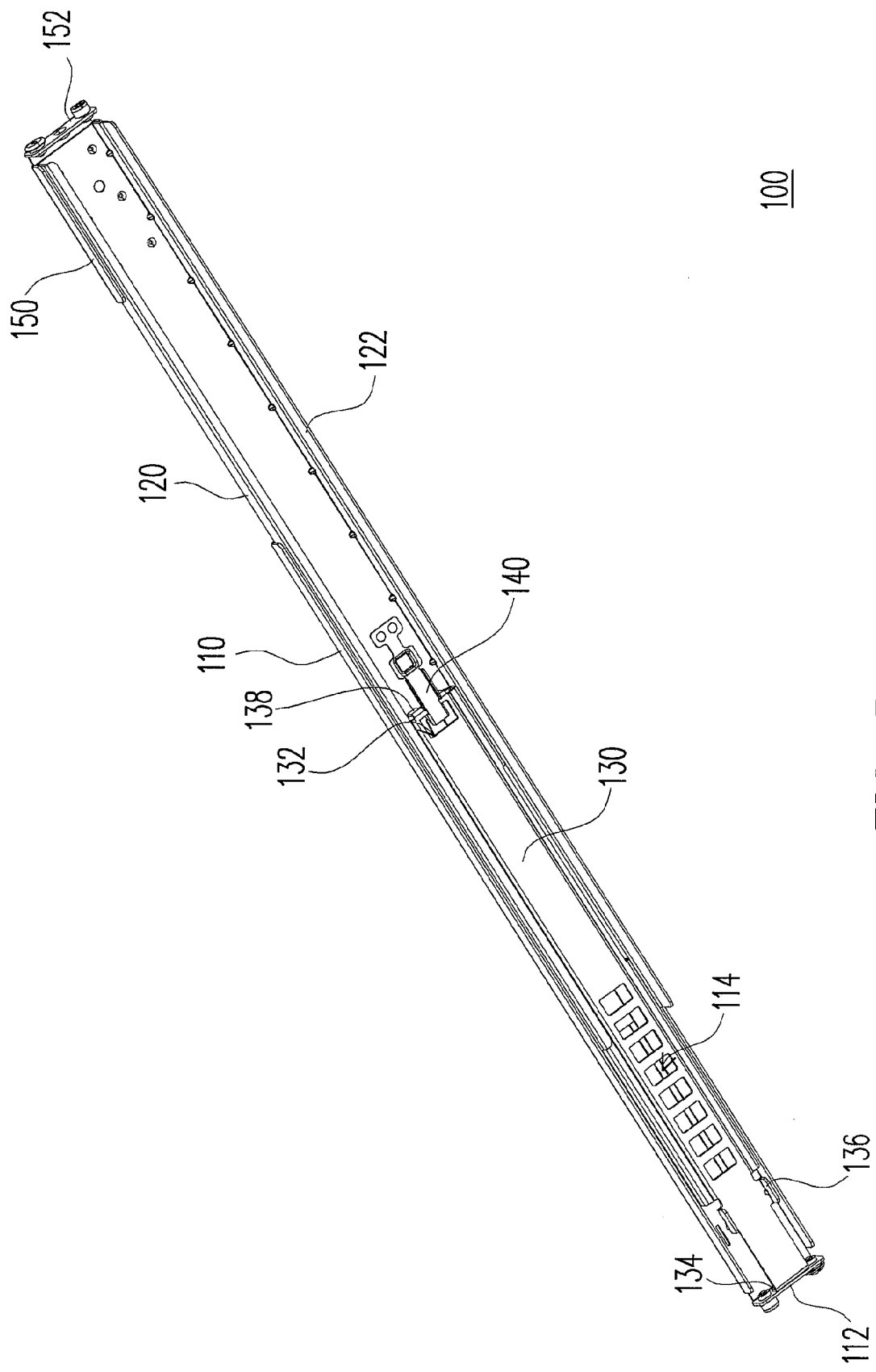
FIG. 3 is a perspective view of a locking portion and a locking component in FIG. 2 which are locked together.

FIG. 1 is an exploded view of a computer case and a slide rail structure according to an embodiment of the present invention, FIG. 2 is a comprehensive diagram of the computer case and the slide rail structure in FIG. 1, and FIG. 3 is a perspective view of a locking portion and a locking component in FIG. 2 which are locked together. Referring to FIGS. 1~3, the slide rail structure 100 is disposed between a computer case (not shown) and a rack (not shown). The slide rail structure 100 includes a first slide rail 110, a second slide rail 120, a third slide rail 130, and a locking component 140 (not shown in FIG. 2). In the present embodiment, the second slide rail 120 is inset in the first slide rail 110, and the third slide rail 130 is inset in the second slide rail 120. A single slide rail structure 100 will be described in the following embodiment. However, in an actual application, slide rail structures 100 can be disposed on both sides of the computer case and the rack in pairs, and the length between both sides of the rack is the width of the rack.

The first slide rail 110 is fastened to the rack. For example, the first slide rail 110 has a fixing portion 112, and the first slide rail 110 is fastened to the rear of the rack through the fixing portion 112. The second slide rail 120 has a first end E1, a second end E2, and a carrier 122. The second slide rail 120 is fastened to the front of the rack through the first end E1. In the present embodiment, the slide rail structure 100 further includes a holder 150. The holder 150 has a fixing portion 152 and a fixing portion 154. The holder 150 is fastened to the rack through the fixing portion 152, and the holder 150 is fastened to the first end E1 of the second slide rail 120 through the fixing portion 154 so that the second slide rail 120 is fastened to the rack through the holder 150.

In addition, the second slide rail 120 is connected to the first slide rail 110 through the second end E2. Namely, before the first slide rail 110 and the second slide rail 120 are fabricated to the rack, the second slide rail 120 is slidingly disposed to the first slide rail 110 through the second end E2 thereof so that the first slide rail 110 and the second slide rail 120 can be adjusted to a length fitting the depth of the rack and fixed to the rack. Such a design also makes the fastening of the slide rails to be more convenient. In the present embodiment, the slide rail structure 100 further includes a plurality of fasteners (for example, screws, not shown). The first slide rail 110 further has a slide slot 114, and the fasteners respectively go through the slide slot 114 to be fastened to the second slide rail 120. When the second slide rail 120 slides correspondingly to the first slide rail 110, the fasteners also slide in the slide slot 114 correspondingly.

Figure 4:
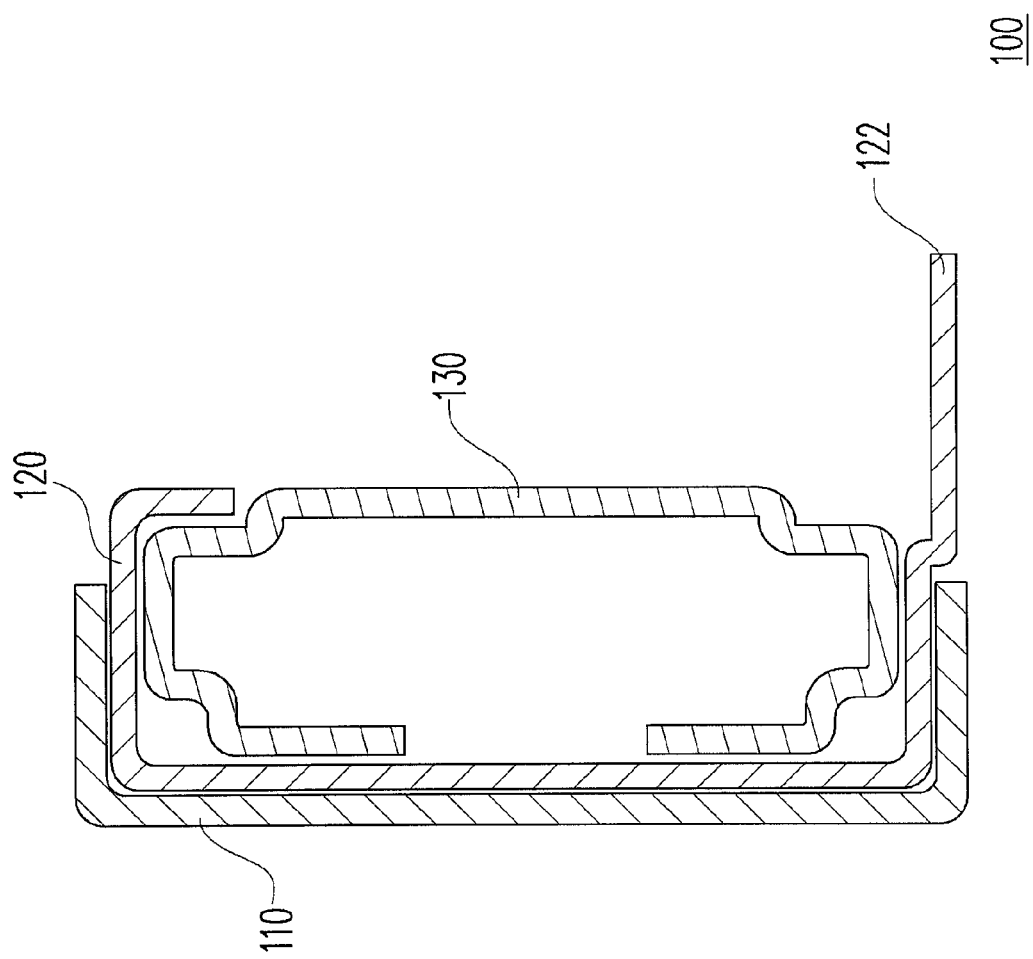
FIG. 4 is a cross-sectional view of FIG. 2.

FIG. 4 is a cross-sectional view of FIG. 2. Referring to FIG. 2 and FIG. 4, the carrier 122 is in contact with a bottom panel (not shown) of the computer case so as to support the computer case and allow the computer case to slide on the carrier 122. It should be mentioned here that since the computer case can slide on the carrier 122 of the second slide rail 120 through the support of the carrier 122, there is no need to fabricate any slide rail to the computer case. Thus, the fabrication of the slide rail structure is made easier and the space required for installing slide rail on the computer case can be saved. Namely, a wider computer case can be mounted onto the same rack because of the reduced space of the slide rail structure 100. In the present embodiment, the first slide rail 110 covers at least part of the second slide rail 120 and the second slide rail 120 covers at least part of the third slide rail 130 so that less space is taken when the computer case is mounted onto the rack.

The third slide rail 130 is slidingly disposed to the second slide rail 120 and has a locking portion 132. The locking component 140 is fastened to the computer case. In the present embodiment, the locking component 140 is a metallic spring leaf and has two (or only one) hooks 142. The locking portion 132 is a hook hole corresponding to the hooks 142. In addition, the locking component 140 may further have a fixing portion 144, and the locking component 140 may be fastened to the internal wall of a side panel (not shown) of the computer case through the fixing portion 144. Besides, the hooks 142 protrude to the outside of the side panel through openings (not shown) on the side panel of the computer case and are locked with the locking portion 132 at the outside of the side panel. When the locking component 140 is under an action force and bends towards the inside of the computer case, the locking component 140 is unlocked from the locking portion 132.

Referring to FIG. 2 and FIG. 3, when the computer case is mounted onto the rack from the front, the hooks 142 slide into the locking portion 132 (the openings) through an inclined surface thereof so that the locking component 140 is locked to the locking portion 132. Accordingly, when the computer case is pulled out of the rack from the front side, the third slide rail 130 moves along with the computer case. In the present embodiment, the first slide rail 110 further has a first blocking portion, and the first blocking portion in the present embodiment is the fixing portion 112. The third slide rail 130 has a second blocking portion 134 corresponding to the first blocking portion 112 for restricting the displacement of the third slide rail 130 toward the inside of the rack. In other words, when the third slide rail 130 moves toward the inside of the rack, the third slide rail 130 moves at most until the second blocking portion 134 contacts the first blocking portion 112.

In addition, the third slide rail 130 further has a third blocking portion 136. When the computer case moves toward the inside of the rack, the computer case contacts the third blocking portion 136 and accordingly brings the third slide rail 130 to move toward the inside of the rack. Namely, the locking portion 132 plays its part when the computer case is pulled out of the rack, while the third blocking portion 136 plays its part when the computer case is pushed into the rack.

In addition, the holder 150 also has a fourth blocking portion, and in the present embodiment, the fourth blocking portion is the fixing portion 152. The third slide rail further has a fifth blocking portion 138 corresponding to the fourth blocking portion (the fixing portion 152) for restricting the displacement of the third slide rail 130 toward the outside of the rack.

Through the interaction between the position of the locking portion 132 on the third slide rail 130 and the position of the locking component 140 on the computer case, the the center of gravity of the computer case is not out of the rack when the fifth blocking portion 138 is blocked by the fixing portion 152, so that the computer case will not fall out of the rack. In this case, if a user wants to pull out the computer case from the rack, the user can reach into the computer case and bend the locking component 140 toward the inside of the computer case until the locking component 140 is separated from the locking portion 132.

As described above, in a slide rail structure provided by the present invention, a computer case is supported by a carrier of a second slid rail and so that the computer case can slide on the carrier. Thus, there is no need to fabricate any slide rail to the computer case. As a result, the space required for installing slide rail between the computer case and the rack can be saved and accordingly the slide rail structure in the present invention can be disposed in a narrower space. Moreover, in the present invention, the computer case is prevented from tilting forwards by locking a locking component on the computer case to a locking portion of a third slide rail.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A slide rail structure, disposed between a computer case and a rack, comprising:
    a first slide rail, fastened to the rack;
    a second slide rail, having a first end, a second end, and a carrier, wherein the second slide rail is fastened to the rack through the first end and is connected to the first slide rail through the second end, and the carrier is in contact with a bottom panel of the computer case to allow the computer case to slide on the carrier, wherein the carrier is not locking with the computer case;
    a third slide rail, slidingly disposed to the second slide rail without carrying the computer case, and having a locking portion;
    a locking component, fastened to the computer case, and locked with the locking portion, wherein when the computer case is pulled out of the rack, the third slide rail moves along with the computer; and
    a holder, fastened to the rack and the first end of the second slide rail so that the second slide rail is fastened to the rack through the holder,
    wherein the holder has a fourth blocking portion, and the third slide rail further has a fifth blocking portion corresponding to the fourth blocking portion for restricting a displacement of the third slide rail toward an outside of the rack.

2. The slide rail structure according to claim 1, wherein the first slide rail has a first blocking portion, and the third slide rail has a second blocking portion corresponding to the first blocking portion for restricting a displacement of the third slide rail toward an inside of the rack.

3. The slide rail structure according to claim 1, wherein the third slide rail further has a third blocking portion, and when the computer case moves toward the inside of the rack, the computer case contacts the third blocking portion and accordingly brings the third slide rail to move toward the inside of the rack.

4. The slide rail structure according to claim 1, wherein through the interaction between a position of the locking portion on the third slide rail and a position of the locking component on the computer case, a the center of gravity of the computer case is not out of the rack when the fifth blocking portion is blocked by the fourth blocking portion.

5. The slide rail structure according to claim 1, wherein the locking component is a metallic spring leaf.

6. The slide rail structure according to claim 1, wherein the locking component has at least one hook, and the locking portion is a hook hole corresponding to the hook.

7. The slide rail structure according to claim 6, wherein the locking component is fastened to an internal wall of a side panel of the computer case, and the hook passes through the side panel and protrudes to an outside of the side panel.

8. The slide rail structure according to claim 1, wherein the locking component is unlocked from the locking portion when the locking component is under an action force and bends towards an inside of the computer case.

9. The slide rail structure according to claim 1, further comprising:
    a plurality of fasteners, wherein the first slide rail has a slide slot, and the fasteners respectively go through the slide slot to be fastened to the second slide rail.

10. The slide rail structure according to claim 1, wherein the second slide rail is slidingly disposed to the first slide rail through the second end.

11. The slide rail structure according to claim 1, wherein the first slide rail covers at least a part of the second slide rail, and the second slide rail covers at least a part of the third slide rail.

12. The slide rail structure according to claim 1, wherein the computer case can be pulled out from the rack by bending the locking component toward an inside of the computer case until the locking component is separated from the locking portion.

* * * * *